(12) United States Patent
Saito

(10) Patent No.: US 7,184,732 B2
(45) Date of Patent: Feb. 27, 2007

(54) PLL FREQUENCY SYNTHESIZER

(75) Inventor: Shinji Saito, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 196 days.

(21) Appl. No.: 10/026,548

(22) Filed: Dec. 27, 2001

(65) Prior Publication Data
US 2002/0132598 A1   Sep. 19, 2002

(30) Foreign Application Priority Data
Mar. 16, 2001   (JP)   ............................. 2001-076131

(51) Int. Cl.
*H04B 7/00* (2006.01)
(52) U.S. Cl. .................... 455/260; 455/209; 455/264; 375/376; 331/25
(58) Field of Classification Search ................ 331/1 R, 331/177 R, 17, 18, 25; 375/376, 373, 374, 375/375; 455/192.1, 192.2, 255–260, 264, 455/265, 205, 208, 209, 230
See application file for complete search history.

(56) References Cited

U.S. PATENT DOCUMENTS

| | | | |
|---|---|---|---|
| 4,812,783 A * | 3/1989 | Honjo et al. ................... 331/20 |
| 5,389,899 A | 2/1995 | Yahagi et al. |
| 5,473,640 A * | 12/1995 | Bortolini et al. ............ 375/376 |
| 5,783,972 A * | 7/1998 | Nishikawa .................... 331/17 |
| 5,794,130 A * | 8/1998 | Abe et al. ...................... 455/76 |
| 5,847,614 A | 12/1998 | Gilbert et al. |
| 5,909,149 A | 6/1999 | Bath et al. |
| 6,125,158 A * | 9/2000 | Carson et al. ............... 375/376 |
| 6,226,509 B1 * | 5/2001 | Mole et al. .................. 455/302 |
| 6,308,049 B1 * | 10/2001 | Bellaouar et al. ............. 455/76 |
| 6,396,217 B1 * | 5/2002 | Weindorf ................. 315/169.1 |
| 6,622,010 B1 * | 9/2003 | Ichimaru ...................... 455/76 |
| 6,714,772 B2 * | 3/2004 | Kasahara et al. ........... 455/260 |

FOREIGN PATENT DOCUMENTS

| | | |
|---|---|---|
| EP | 1 047 196 A | 10/2000 |
| JP | A-5-183432 | 7/1993 |
| JP | A-10-51299 | 2/1998 |

OTHER PUBLICATIONS

Patent Abstract of Japan, vol. 0175, No. 99, Nov. 2, 1993 & JP 5 183432 A, Jul. 23, 1993.

* cited by examiner

*Primary Examiner*—Edward F. Urban
*Assistant Examiner*—Nhan T. Le
(74) *Attorney, Agent, or Firm*—Arent Fox, LLP

(57) ABSTRACT

A PLL frequency synthesizer suitable for improving even a spurious characteristic in a lock state while ensuring a high-speed lockup characteristic to thereby implement satisfactoy communication quality includes a switch circuit interposed between a low-pass filter circuit and a voltage-controlled oscillator controlled based on a control signal to open/close control a feedback loop lying between the low-pass filter circuit and the voltage-controlled oscillator. The switch circuit is opened according to a path-opening instruction of a feedback loop based on the control signal to open the feedback loop, thereby stopping the operation of the feedback loop. If this stop operation is controlled according to the control signal so as to he carried out during a period in which a pseudo correction pulse is outputted from a charge pump circuit for each phase comparison cycle of a phase comparator, then spurious generation incident to the pseudo correction pulse can be suppressed.

28 Claims, 13 Drawing Sheets

FUNCTION BLOCK DIAGRAM DEPICTING A SPECIFIC EXAMPLE OF THE PLL FREQUENCY SYNTHESIZER ACCORDING TO FIRST EMBODIMENT

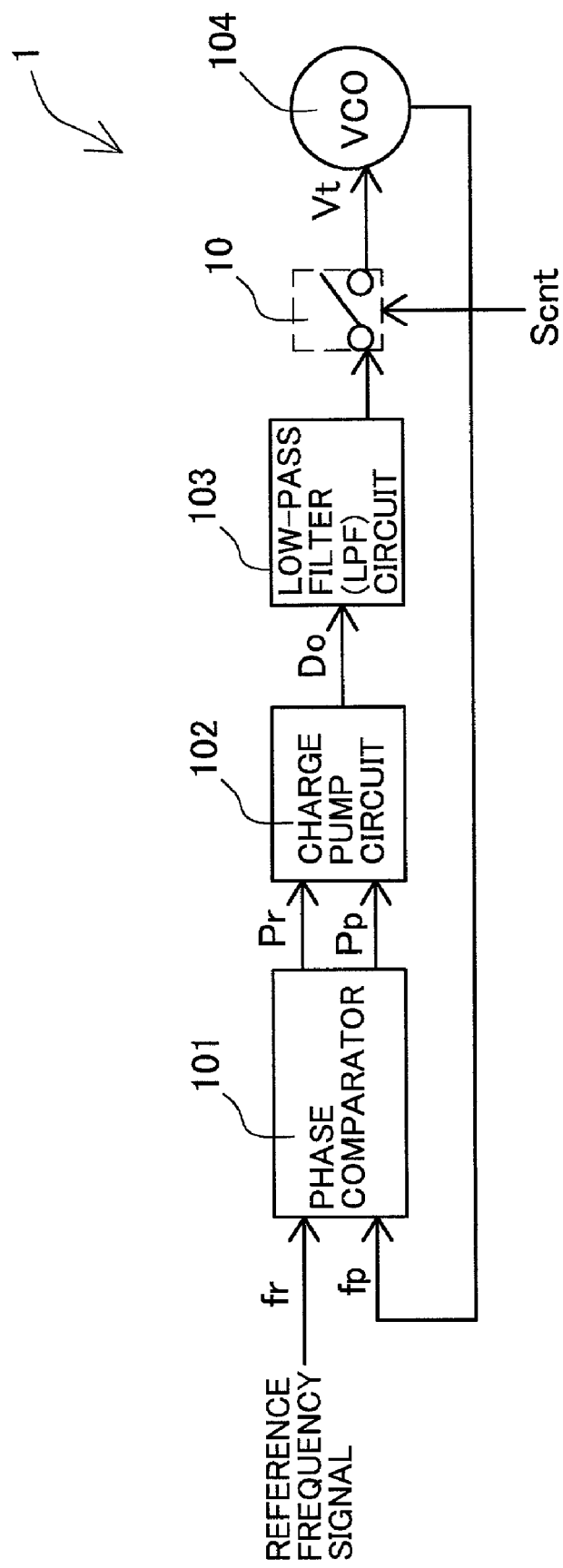
FIG.1 FUNCTION BLOCK DIAGRAM SHOWING A PLL FREQUENCY SYNTHESIZER ACCORDING TO FIRST EMBODIMENT

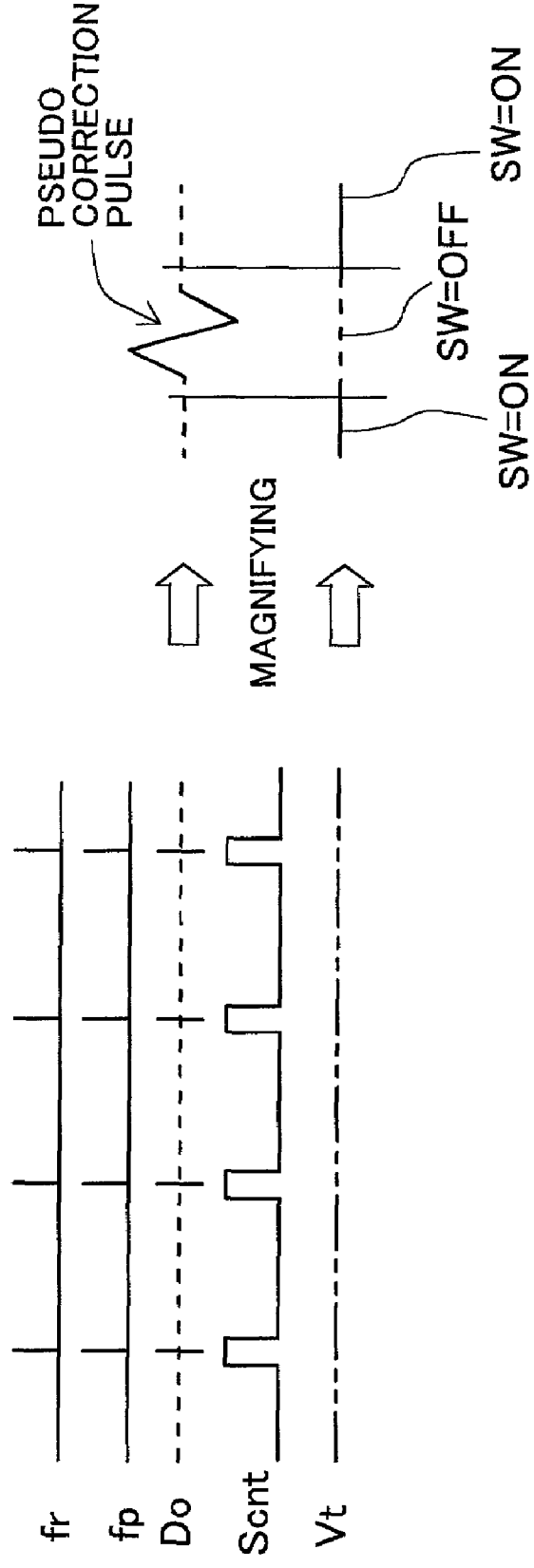
FIG.2 WAVEFORM DIAGRAM ILLUSTRATING OPERATING WAVEFORMS OF THE PLL FREQUENCY SYNTHESIZER ACCORDING TO FIRST EMBODIMENT

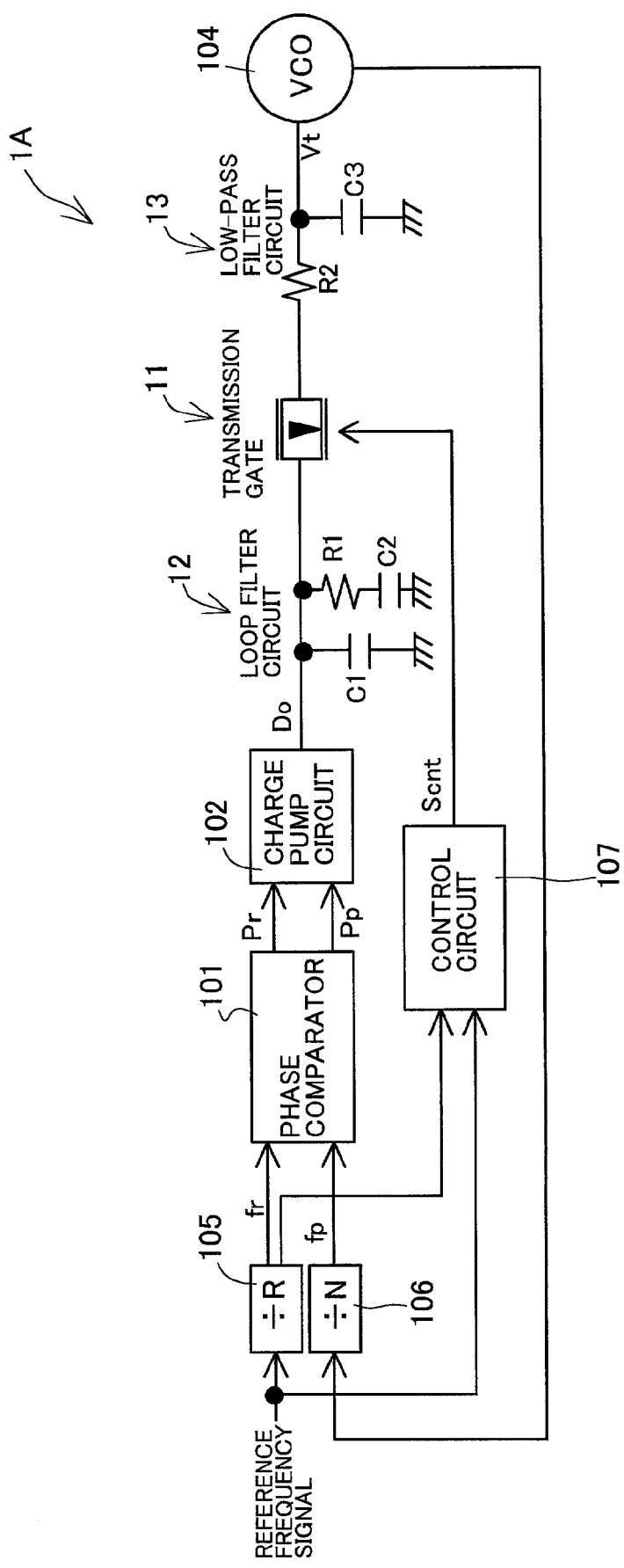
FIG.3 FUNCTION BLOCK DIAGRAM DEPICTING A SPECIFIC EXAMPLE OF THE PLL FREQUENCY SYNTHESIZER ACCORDING TO FIRST EMBODIMENT

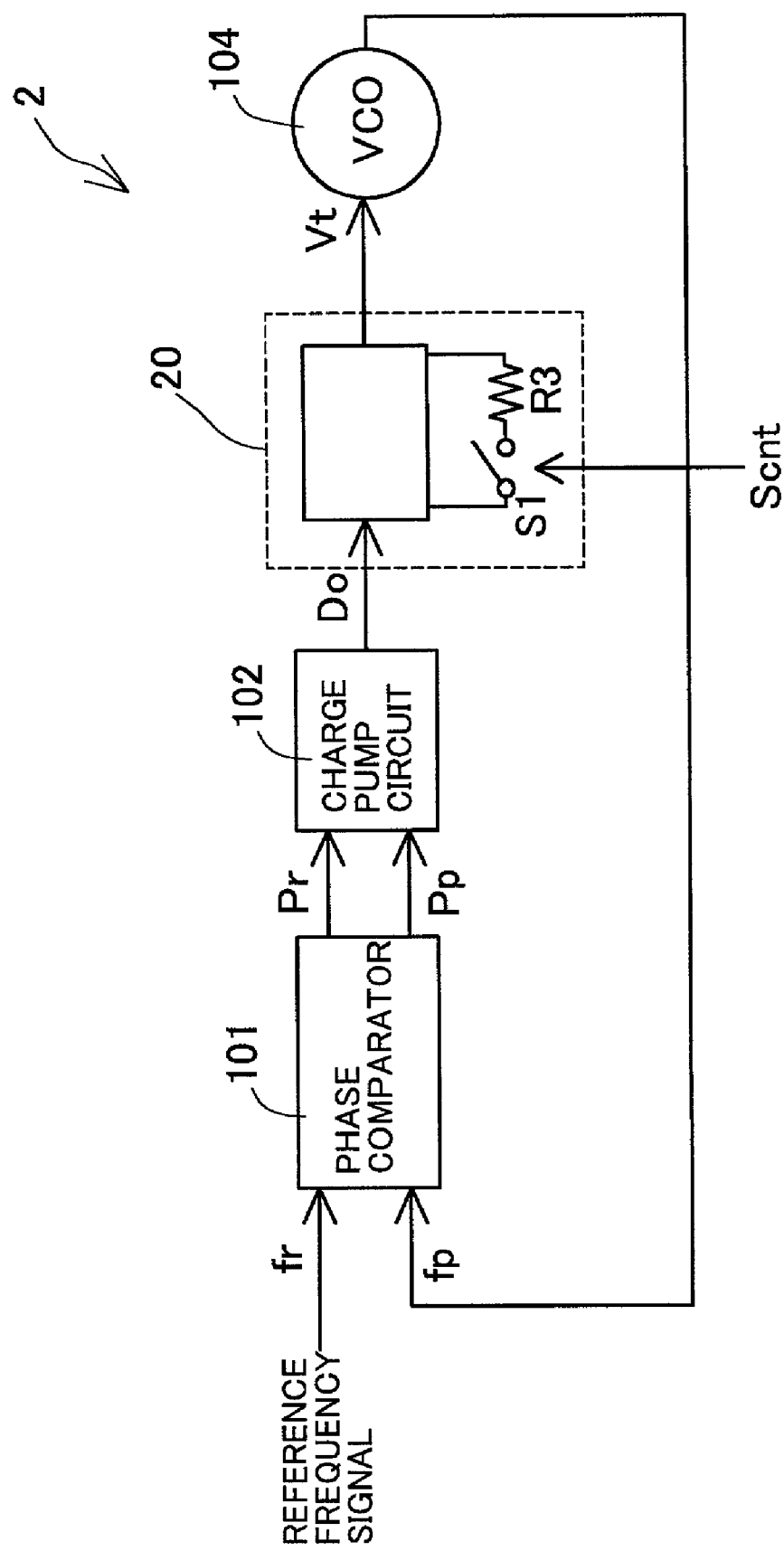
FIG.4 FUNCTION BLOCK DIAGRAM SHOWING A PLL FREQUENCY SYNTHESIZER ACCORDING TO SECOND EMBODIMENT CIRCUIT DIAGRAM ILLUSTRATING SPECIFIC EXAMPLES OF A LOW-PASS FILTER (LPF) CIRCUIT EMPLOYED IN SECOND EMBODIMENT

TYPE WHEREIN PARALLEL PATHS ARE SELECTED

TYPE WHEREIN SERIAL PATHS ARE SELECTED

FUNCTION BLOCK DIAGRAM DEPICTING A PLL FREQUENCY SYNTHESIZER ACCORDING TO THIRD EMBODIMENT

CIRCUIT DIAGRAM SHOWING A SPECIFIC EXAMPLE OF A LOW-PASS FILTER (LPF) CIRCUIT EMPLOYED IN THIRD EMBODIMENT

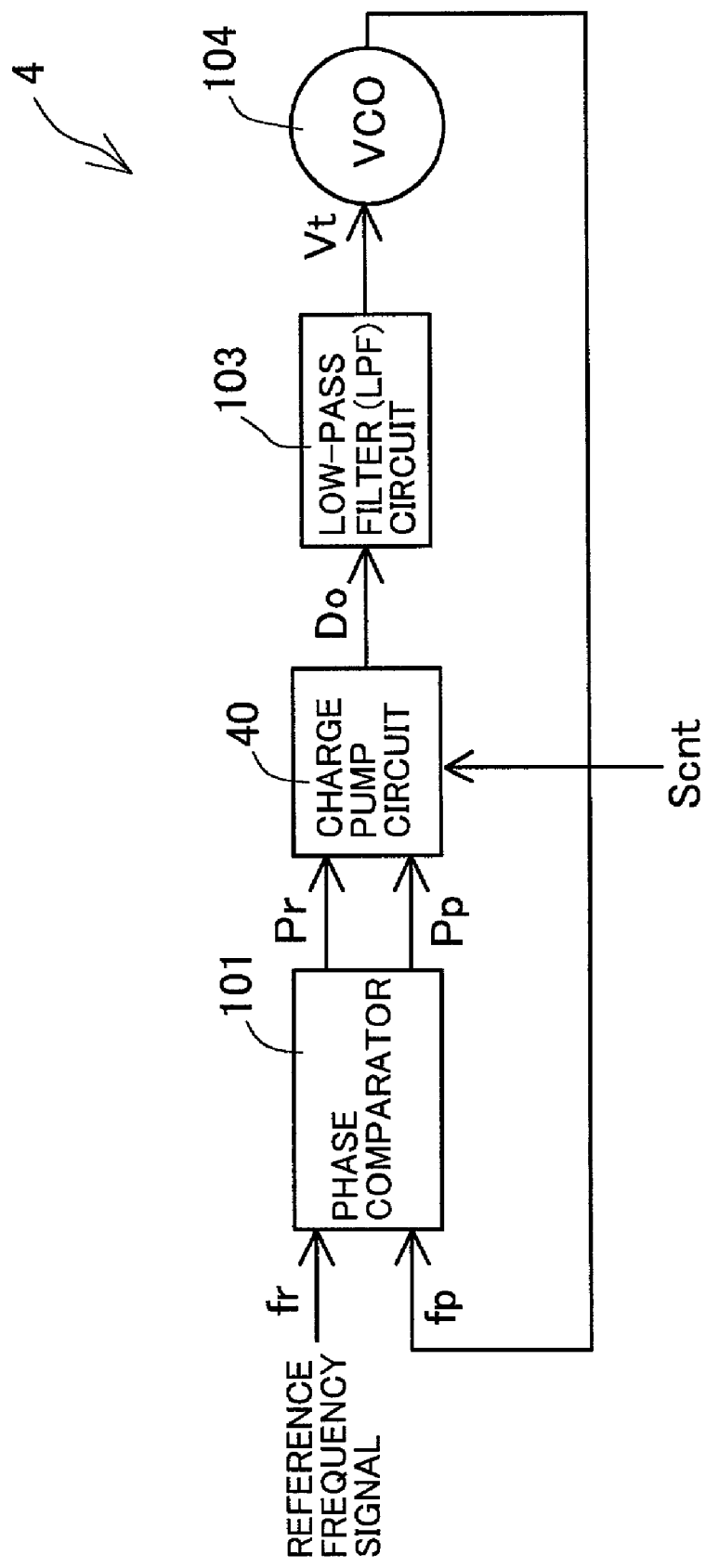
FIG.8 FUNCTION BLOCK DIAGRAM ILLUSTRATING A PLL FREQUENCY SYNTHESIZER ACCORDING TO FOURTH EMBODIMENT CIRCUIT DIAGRAM SHOWING SPECIFIC EXAMPLES OF A CHARGE PUMP CIRCUIT EMPLOYED IN FOURTH EMBODIMENT

TYPE THAT IT OPENS OR CLOSES OUTPUT PATHS

TYPE WHEREIN SOURCE VOLTAGES ARE SWITCHED

TYPE WHEREIN DRIVING CAPACITIES ARE SWITCHED

CIRCUIT DIAGRAM DEPICTING A SPECIFIC EXAMPLE OF
A LOW-PASS FILTER (LPF) CIRCUIT

VOLTAGE-DRIVEN TYPE

CURRENT-DRIVEN TYPE

FUNCTION BLOCK DIAGRAM SHOWING A PLL FREQUENCY SYNTHESIZER ACCORDING TO PRIOR ART

WAVEFORM DIAGRAM ILLUSTRATING OPERATING WAVEFORMS OF THE PLL FREQUENCY SYNTHESIZER ACCORDING TO PRIOR ART

FIG.13
CHARACTERISTIC DIAGRAM SHOWING INPUT/OUTPUT CHARACTERISTICS OF A CHARGE PUMP CIRCUIT
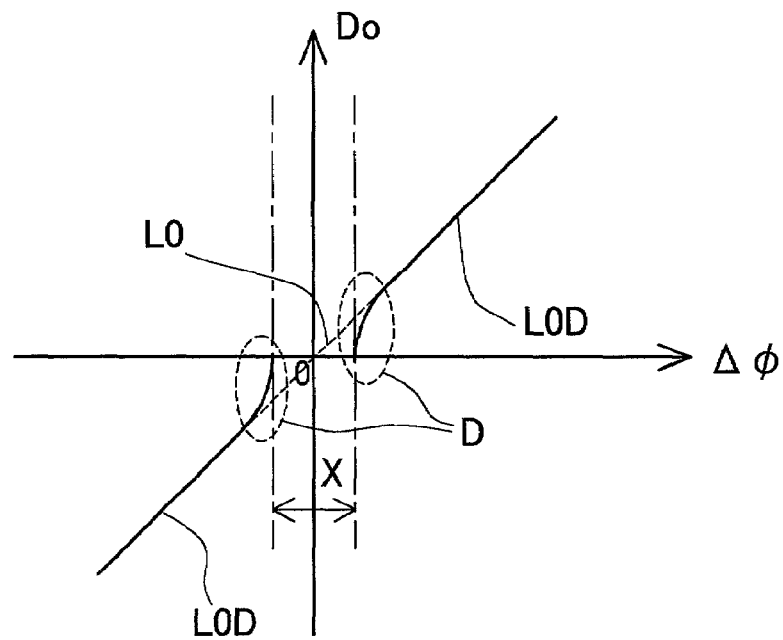
SOLVING THE DEAD ZONAL REGION
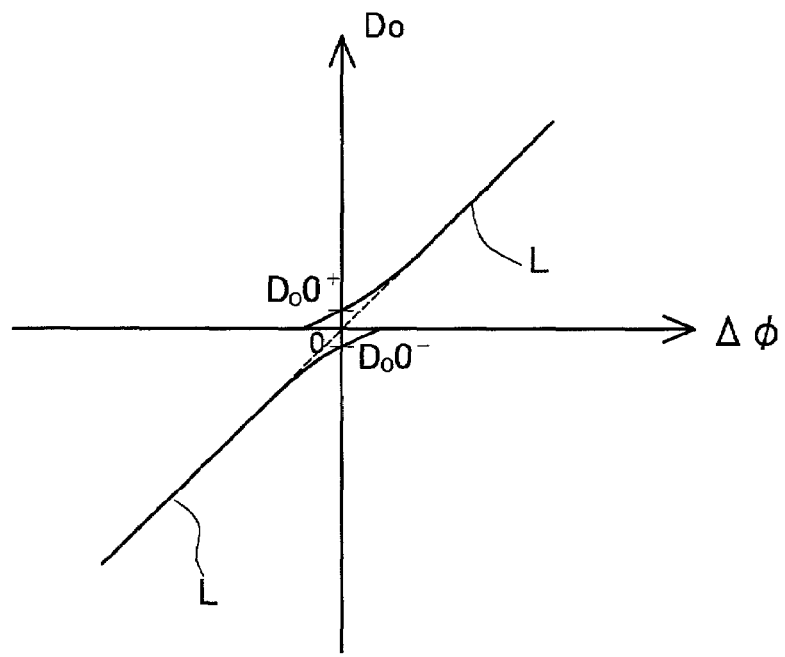

“PLL FREQUENCY SYNTHESIZER

BACKGROUND OF THE INVENTION

1. Field of the Invention

The present invention relates to a PLL frequency synthesizer, and particularly to a PLL frequency synthesizer capable of achieving an improvement in spurious characteristic in a steady state while maintaining a high-speed lockup characteristic.

2. Description of the Related Art

In mobile communications for cellular telephones or the like which have widely been available in recent years, communications are made based on a carrier frequency corresponding to a predetermined frequency. In order to ensure communication quality and satisfactorily keep a C/N (Carrier to Noise) characteristic in the communications at this time, there is a need to accurately lock a predetermined carrier frequency, and hence a PLL frequency synthesizer has been used. The operation of locking the carrier frequency by the PLL frequency synthesizer is needed not only during a communication period but also during a so-called standby period corresponding to a state of waiting for reception from the party on the other end of the communication. That's why it needs to always detect the presence or absence of a communication access from the communication party and immediately establish communications when the access is received. On the other hand, a mobile communications apparatus such as a cellular phone or the like needs to reduce its current consumption to the minimum according to its portability. Thus, in the apparatuses used under the present conditions in order to implement a standby or awaiting operation while current consumption is being suppressed, a PLL frequency synthesizer is intermittently operated only during a predetermined period set for each predetermined cycle to carry out an intermittent operation for locking a carrier frequency and performing the standby operation, thereby coping with it. With a view toward promptly carrying out a repeated operation of lock and stop operations at a carrier frequency for each predetermined cycle or period, it is necessary to make a lockup characteristic of the PLL frequency synthesizer faster and set low the time constant of a low-pass filter circuit.

FIG. 11 shows a PLL frequency synthesizer 100 according to a prior art. A phase comparator 101 receives therein a reference frequency signal fr and an output frequency signal fp outputted from a voltage-controlled oscillator (VCO) 104. Then the phase comparator 101 outputs phase difference signals Pr and Pp each corresponding to the difference in phase between the reference frequency signal fr and the output frequency signal fp. A charge pump circuit 102 receives these signals therein and outputs a voltage output signal Do. A low-pass filter (LPF) circuit 103 eliminates AC components of the voltage output signal Do and makes adjustments around the phase to ensure the stability of a system. Besides, the low-pass filter (LPF) circuit 103 outputs a control voltage signal Vt to the voltage-controlled oscillator (VCO) 104. Then the voltage-controlled oscillator (VCO) 104 outputs the output frequency signal fp corresponding to the control voltage signal Vt. The PLL frequency synthesizer 100 forms a feedback loop which returns from the phase comparator 101 to the phase comparator 101 via the charge pump circuit 102, the low-pass filter (LPF) circuit 103 and the voltage control oscillator (VCO) 104. The phase difference signals Pr and Pp, which cancel out the phase difference between the reference frequency signal fr and the output frequency signal fp compared with the reference frequency signal fr are outputted from the charge pump circuit 102 and fed back to the voltage controlled-oscillator (VCO) 104 as the control voltage signal Vt through the low-pass filter (LPF) circuit 103. If the frequency of the output frequency signal fp coincides with that of the reference frequency signal fr, then no phase difference signals Pr and Pp are outputted and the output frequency signal fp is locked to the same frequency as that of the reference frequency signal fr. In order to make faster a lockup time of the low-pass filter (LPF) circuit 103 here, there is a need to set low the time constant of the low-pass filter (LPF) circuit 103.

Japanese Patent Application Laid-Open No. Hei 10(1998)-51299 has described a PLL frequency synthesizer circuit including a PLL synthesizer IC using phase-locked loop, a low-pass filter LPF which converts the output of the IC to a DC voltage, and a voltage-controlled oscillator VCO which outputs a frequency corresponding to a control voltage, wherein switching means for separating the output of a phase comparator of the PLL synthesizer IC from the LPF prior to timing provided to turn ON/OFF a source or power supply for a load circuit, and connecting the output of the phase comparator of the PLL synthesizer IC to the LPF again is provided.

Japanese Patent Application Laid-Open No. Hei 5(1993)-183432 has described a clock reproducing circuit having a voltage-controlled oscillator which generates an output signal varied in frequency according to an input control signal, a phase comparator which compares the phase of an intermittently applied input signal and that of the output signal of the voltage-controlled oscillator and sends out its corresponding phase difference signal, and a first low-pass filter unit which eliminates unnecessary components in the phase difference signal, wherein a second low-pass filter unit which takes out a component corresponding to the difference between the frequency of the input signal and the free-running frequency of the voltage-controlled oscillator, and switch/adding means which sends out a signal as the control signal obtained by adding the output of the first low-pass filter unit and the output of the second low-pass filter unit when the input signal is applied, and sends out the output of the second low-pass filter unit as the control signal when no input signal is applied, are added thereto.

When the frequency of the output frequency signal fp is locked to the same frequency as the reference frequency signal fr by the aforementioned PLL frequency synthesizer 100, the phase difference signals Pr and Pp of the phase comparator 101 are not outputted as the average. Even in this state, however, a phase correction pulse having the same amounts of positive and negative energy is outputted to the voltage output signal Do produced from the charge pump circuit 102 during an output period of the reference frequency signal fr corresponding to a phase comparison period in the phase comparator 101 as shown in FIG. 12 (hereinafter called "pseudo correction pulse"). While the present pulse can be eliminated by adjusting the time constant of the low-pass filter (LPF) circuit 103, it has a trade-off relationship with a lockup characteristic. Namely, if the time constant of the low-pass filter (LPF) circuit 103 is set high, then the pseudo correction pulse in the voltage output signal Do can be masked but a lockup time becomes long. Thus, this does not match the demand for a high-speed lockup characteristic, thereby causing a problem. If the time constant of the low-pass filter (LPF) circuit 103 is set low in reverse, then the demand for the high-speed lockup characteristic can be satisfied but the pseudo correction pulse in the voltage output signal Do cannot be masked. Thus, spurious outputs are developed, so that C/N is degraded and communication quality cannot be ensured, thereby causing a problem. The prior art is accompanied by a problem due to the possibility that the time constant should unavoidably be adjusted at a compromise between both characteristics, and the optimum operating state cannot be implemented where further speeding-up ahead is viewed.

A description will now be made of the reason why the pseudo correction pulse in the voltage output signal Do is developed. FIG. 13 shows an input/output characteristic of the charge pump circuit 102. The charge pump circuit 102 is a circuit which outputs a voltage output signal Do proportional to each of input phase difference signals $\Delta\phi$ (Pr and Pp in FIG. 11). The phase difference signal $\Delta\phi$ at this time takes a phase delay of the output frequency signal fp with respect to the reference frequency signal fr as positive. Thus, when the phase of the output frequency signal fp is delayed and a positive phase difference signal $\Delta\phi$ is inputted, a positive voltage output signal Do is outputted and inputted to the voltage-controlled oscillator (VCO) 104 through the low-pass filter (LPF) circuit 103, where the phase of the output frequency signal fp is advanced, whereby the output frequency signal fp approaches the reference frequency signal fr so as to lock. When the phase of the output frequency signal fp leads and a negative phase difference signal $\Delta\phi$ is inputted in reverse, a negative voltage output signal Do is outputted and inputted to the voltage-controlled oscillator (VCO) 104 through the low-pass filter (LPF) circuit 103, where the phase of the output frequency signal fp is delayed, whereby the output frequency signal fp approaches the reference frequency signal fr so as to lock. Ideally, the phase difference signals $\Delta\phi$ and the voltage output signal Do need to have a linear relation (see characteristic straight line L0 in FIG. 13). In the actual charge pump circuit 102, however, the relationship between the phase difference signals $\Delta\phi$ and the voltage output signal Do in a small phase-difference region X becomes non-linear due to the time of a delay in finite signal propagation time of the circuit (see regions D in characteristic curves L0D in FIG. 13) and hence no voltage output signal Do is outputted. This small phase-difference region X is called a dead or blind zone. Thus, in order to solve the dead zonal region X, the actual charge pump circuit 102 is generally configured so as to have nonlinear characteristics obtained by shifting the characteristics of the phase difference signals $\Delta\phi$ and the voltage output signal Do in the direction to decrease gain as viewed from the linear characteristic in the dead zonal region X (see characteristic curves L in FIG. 13). Owing to the provision of such characteristic curves L, the voltage output signal Do relative to the phase difference signals $\Delta\phi$ has finite gain even in the minute phase-difference region X, and hence a phase correction pulse is outputted.

Japanese Patent Application Laid-Open No. Hei 10(1998)-51299 aims to prevent the occurrence of a variation in frequency due to the turning ON/OFF of a power source or supply for a load circuit and transmit or receive data immediately after the power source is connected to the load circuit. However, the present publication does not disclose a technical idea wherein spurious generation in a steady state of the PLL frequency synthesizer circuit is suppressed while the time constant of the low-pass filter LPF is being reduced low and a high-speed lockup characteristic is being improved. Thus, a problem arises in that a trade-off relation between the two cannot be solved and both the high-speed lockup characteristic and a low spurious characteristic at the steady time cannot be realized.

Japanese Patent Application Laid-Open No. Hei 5(1993)-183432 aims to always supply a proper reproduced clock even when a receiver is shifted from as top state to an operating state. However, the present publication does not show a technical idea wherein spurious generation in a steady state is suppressed while the time constant of the first low-pass filter unit is being reduced low and a high-speed lockup characteristic is being improved. Thus, a problem arises in that a trade-off relation between the two cannot be solved and both the high-speed lockup characteristic and a low spurious characteristic at the steady time cannot be realized.

SUMMARY OF THE INVENTION

The present invention has been made to solve the problems of the prior arts. The present invention aims to provide a PLL frequency synthesizer capable of improving even a spurious characteristic in a lock state to thereby realize satisfactory communication quality while a high-speed lockup characteristic is being ensured.

In order to achieve the above object, a PLL frequency synthesizer according to one aspect of the present invention comprises a voltage-controlled oscillator for outputting an output frequency signal according to a control voltage signal, a phase comparator for outputting an output signal corresponding to a phase comparison between the output frequency signal and a reference frequency signal, and a charge pump circuit for varying the control voltage signal according to the phase-compared signal, whereby a feedback loop is configured, wherein signal flow of the feedback loop is periodically varied in a phase comparison cycle used in the phase comparator.

Thus, the signal flow of the feedback loop can be varied during the period in which the pseudo correction pulse is outputted from the charge pump circuit for each phase comparison period or cycle of the phase comparator. Therefore, the characteristic of response of the voltage-controlled oscillator to the pseudo correction pulse outputted from the charge pump circuit can be controlled while the signal flow of the feedback loop in the steady operating state other than the pseudo correction pulse output period set for each phase comparison cycle is being maintained. Further, spurious generation that occurs due to the pseudo correction pulse can be suppressed in the steady operating state of the PLL frequency synthesizer.

The above and further objects and novel features of the invention will more fully appear from following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention.

In the drawings,

FIG. 1 is a function block diagram showing a PLL frequency synthesizer according to a first embodiment of the present invention;

FIG. 2 is a waveform diagram illustrating operating waveforms of the PLL frequency synthesizer according to the first embodiment;

FIG. 3 is a function block diagram depicting a specific example of the PLL frequency synthesizer according to the first embodiment;

FIG. 4 is a function block diagram showing a PLL frequency synthesizer according to a second embodiment of the present invention;

FIG. 8 is a function block diagram illustrating a PLL frequency synthesizer according to a fourth embodiment of the present invention;

FIG. 13 is a characteristic diagram showing input/output characteristics of a charge pump circuit.

DETAILED DESCRIPTION OF THE PREFERRED EMBODIMENTS

First through fourth embodiments in which PLL frequency synthesizers of the present invention have been embodied respectively, will hereinafter be described in detail with reference to the accompanying drawings based on FIGS. 1 through 10.

Figure 11:
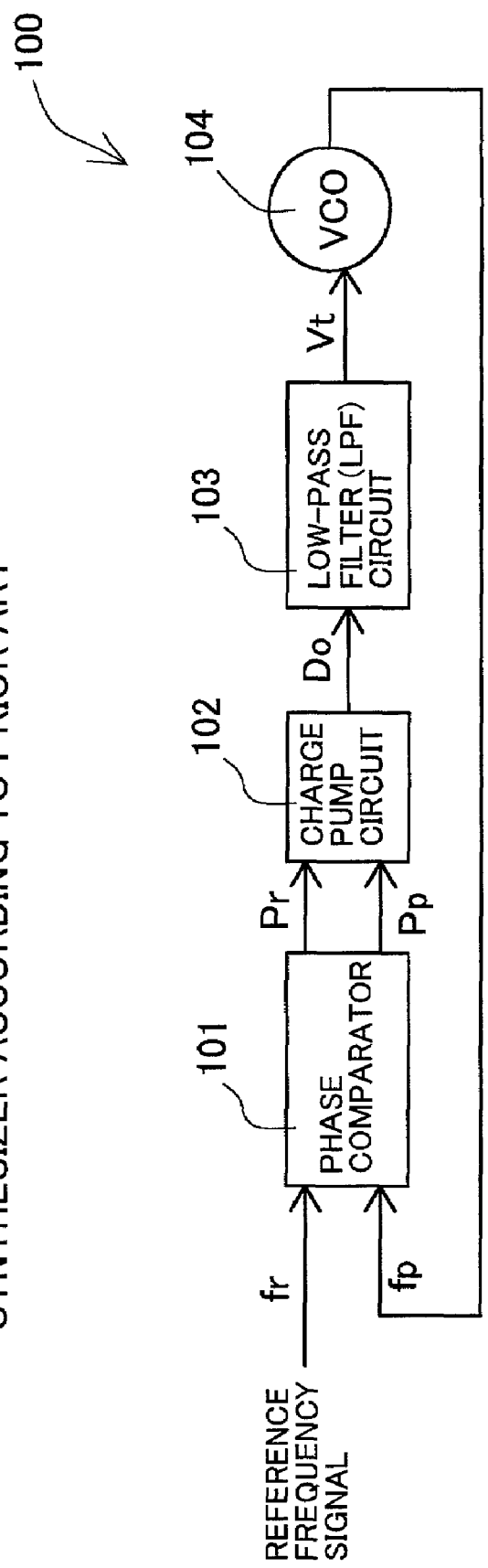
FIG. 11 is a function block diagram showing a PLL frequency synthesizer according to a prior art.
Figure 12:
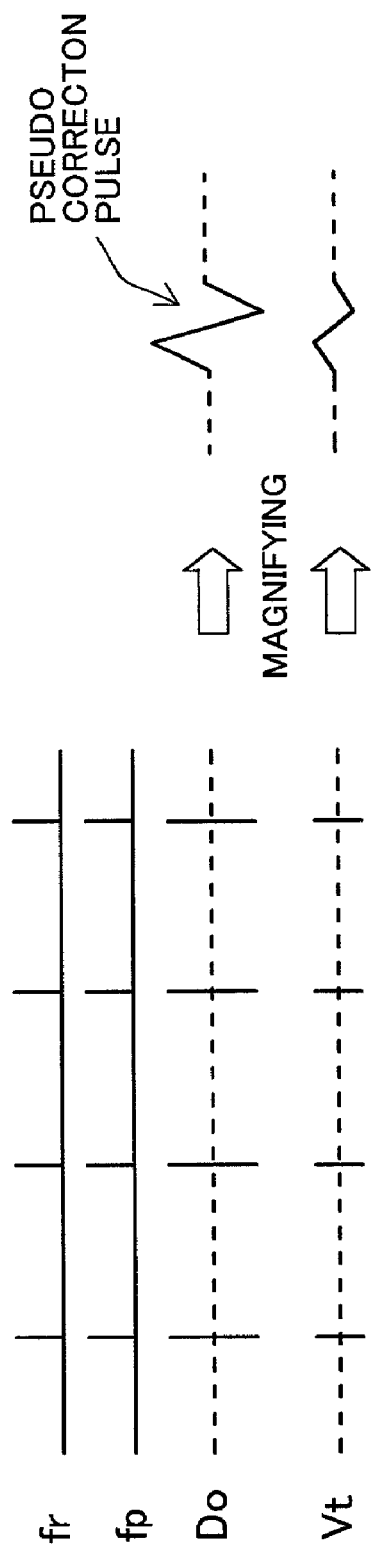
FIG. 12 is a waveform diagram illustrating operating waveforms of the PLL frequency synthesizer according to the prior art.

A PLL frequency synthesizer according to a first embodiment shown in FIG. 1 has a configuration wherein a switch circuit 10 controlled by a control signal Scnt is interposed between a low-pass filter (LPF) circuit 103 and a voltage-controlled oscillator (VCO) 104 in addition to the function block diagram showing the prior art shown in FIG. 11. In the present embodiment, respective components of a phase comparator 101, a charge pump circuit 102, a low-pass filter (LPF) circuit 103 and a voltage-controlled oscillator (VCO) 104 are similar to the prior art shown in FIG. 11 in their configurations, operations and effects. Further, the configuration of the PLL frequency synthesizer 1 wherein a frequency signal fp outputted from the voltage-controlled oscillator (VCO) 104 is fed back to the phase comparator 101 so as to constitute a feedback loop, is also similar to the prior art shown in FIG. 11.

In the first embodiment illustrated in FIG. 1, the switch circuit 10 is controlled by the control signal Scnt to control the opening/closing of the feedback loop between the low-pass filter (LPF) circuit 103 and the voltage-controlled oscillator (VCO) 104. Namely, when a feedback loop opening instruction is given according to the control signal Scnt, the switch circuit 10 is turned off to open up the feedback loop, thereby making it possible to stop the operation of the feedback loop. If this stop operation is controlled according to the control signal Scnt so as to be executed during a period in which a pseudo correction pulse is outputted from the charge pump circuit 102 for each phase comparison cycle of the phase comparator 101, then spurious generation incident to the pseudo correction pulse can be suppressed.

In operating waveforms of the PLL frequency synthesizer, which are shown in FIG. 2, an output frequency signal fp shows a steady state of being locked into a reference frequency signal fr. A phase comparing operation at this time is carried out with an output period or cycle of the reference frequency signal fr as a phase comparison period or cycle. A pseudo correction pulse is outputted for a voltage output signal Do of the charge pump circuit 102 with the phase comparing operation made during the phase comparison period. Thus, the control signal Scnt is outputted inclusive of the phase comparison period corresponding to the output period of the reference frequency signal fr. The switch circuit 10 having received the control signal Scnt opens the feedback loop to thereby allow the suppression of propagation of the pseudo correction pulse included in the voltage output signal Do.

Incidentally, the operating waveforms of the PLL frequency synthesizer 1, which are shown in FIG. 2 are also similar even in the case of steady states that occur in the second through fourth embodiment to be described later. Since a change in the signal flow of each feedback loop or its operation stop is made inclusive of an output period of a reference frequency signal fr, corresponding to a phase comparison period of a phase comparator 101, a pseudo correction pulse to be outputted from each of charge pump circuits 102 and 40 through 45 during that period can be suppressed or inhibited. Further, while the signal flow of each feedback loop in a steady operating state other than a pseudo correction pulse output period is being held, spurious generation incident to a pseudo correction pulse can be inhibited in the steady operating state of each of the PLL frequency synthesizers 2 through 4.

In the PLL frequency synthesizer 1 according to the first embodiment, the switch circuit 10 used as the loop opening/closing switch circuit is controlled based on the control signal Scnt during the period in which the pseudo correction pulse is outputted from the charge pump circuit 102 for each phase comparison cycle of the phase comparator 101 to open up the feedback loop, thereby making it possible to stop the operation of the feedback loop. Thus, while the operation of the feedback loop placed in the steady operating state other than the pseudo correction pulse output period for each phase comparison cycle is being maintained, the operation of the feedback loop relative to the pseudo correction pulse outputted from the charge pump circuit 102 can be stopped, and the spurious generation incident to the pseudo correction pulse can be inhibited in the steady operating state of the PLL frequency synthesizer 1.

A PLL frequency synthesizer 1A illustrative of a specific example of the first embodiment, which is shown in FIG. 3, has a configuration wherein a R frequency divider 105 for dividing a reference frequency signal by R and an N frequency divider 106 for dividing an output frequency signal by N are provided in addition to the first embodiment of FIG. 1, and they respectively input a R-divided frequency signal fr and an N-divided frequency signal fp to a phase comparator 101, where they are subjected to phase comparison. Further, a control circuit 107, which utilizes both the reference frequency signal used as a signal inputted to the R frequency divider 105 and a signal outputted therefrom as input signals, outputs a control signal Scnt to control a transmission gate 11 comprised of MOS transistors, which indicates a specific circuit configuration of the switch circuit 10. The present specific example has a configuration in which in place of the low-pass filter (LPF) circuit 103 employed in the first embodiment of FIG. 1, a loop filter circuit 12 is provided in a stage antecedent to the transmission gate 11 and a low-pass filter circuit 13 is provided in a stage subsequent to the transmission gate 11.

The present example is similar to the PLL frequency synthesizer 1 (see FIG. 1) according to the first embodiment in terms of the configuration wherein the transmission gate 11 is opened so as to avoid the propagation of a pseudo correction pulse included in a voltage output signal Do. In the present specific example, the control circuit 107 outputs a control signal Scnt inclusive of an output period of a pseudo correction pulse while detecting timings provided to start and complete a phase comparison period, based on the reference frequency signal used as the input signal of the R frequency divider 105 and its output signal.

Further, the PLL frequency synthesizer 1A is provided with two filter circuits corresponding to the loop filter circuit 12 and the low-pass filter circuit 13 interposing the transmission gate 11 therebetween, both of which determine various characteristics such as the response, stability, etc. relating to signal flow of a feedback loop. Further, the low-pass filter circuit 13 provided in the stage subsequent to the transmission gate 11 also has the function of removing switching noise of the transmission gate 11 and holding a potential of a control voltage signal Vt used as the input of a voltage-controlled oscillator 104 upon the opening of the transmission gate 11. Of the two filter circuits 12 and 13 in practical use, the loop filter circuit 12 may principally be put in charge of the action of determining the signal flow of the feedback loop, and the low-pass filter circuit 13 may be put in charge of the function of removing the switching noise and holding the potential. Since, in this case, the time constant of the low-pass filter circuit 13 can be set small, a wiring resistance may be used as an alternative without providing a resistor R2 with a discrete resistive elemental device.

The PLL frequency synthesizer 1A illustrative of the specific example of the first embodiment controls the transmission gate 11 corresponding to a loop opening/closing switch circuit according to the control signal Scnt outputted from the control circuit 107 to open or set free the feedback loop, thereby allowing the stop of the operation of the feedback loop during a period in which a pseudo correction pulse is outputted from a charge pump circuit 102 for each phase comparison period of the phase comparator 101. Thus, the PLL frequency synthesizer 1A is capable of stopping the operation of the feedback loop with respect to the pseudo correction pulse outputted from the charge pump circuit 102 while maintaining the operation of the feedback loop in a steady operating state other than a pseudo correction pulse output period set for each phase comparison cycle. Spurious generation incident to the pseudo correction pulse can be suppressed in the steady operating state while the time constants of the loop filter circuit 12 corresponding to the first filter circuit and the low-pass filter circuit 13 corresponding to the second filter circuit are being made small to maintain a high-speed lockup characteristic.

Further, since the loop filter circuit 12 and the low-pass filter circuit 13 are provided with the transmission gate 11 interposed therebetween, the two determine various characteristics such as the response, stability, etc. relating to signal flow of the feedback loop and are capable of removing switching noise of the transmission gate 11 and holding a potential of a control voltage signal Vt used as the input of the voltage-controlled oscillator 104 upon the opening of the transmission gate 11.

A PLL frequency synthesizer 2 according to a second embodiment shown in FIG. 4 is provided with a low-pass filter (LPF) circuit 20 capable of performing switching to filter characteristics according to a control signal Scnt as an alternative to the low-pass filter (LPF) circuit 103 of the PLL frequency synthesizer 100 according to the prior art shown in FIG. 11. Connectably and disconnectably providing a resistive elemental device R3 according to a control signal Scnt in FIG. 4 makes it possible to vary the characteristics of the low-pass filter (LPF) circuit 20.

Figure 5A:
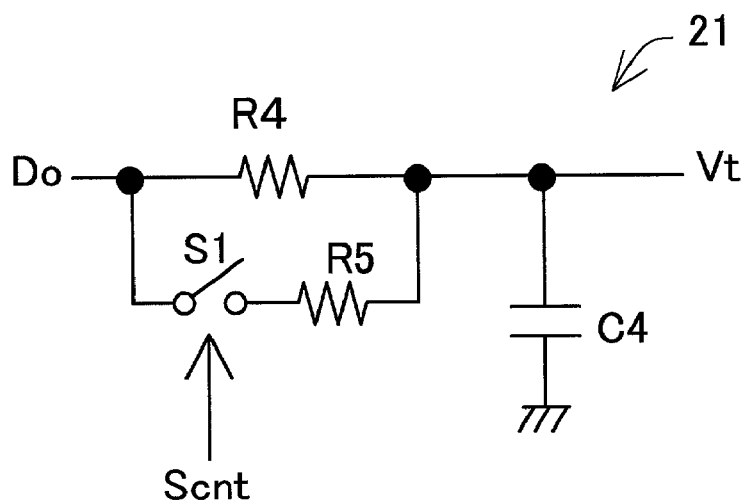
FIGS. 5A and 5B are circuit diagrams illustrating specific examples of a low-pass filter (LPF) circuit employed in the second embodiment.

FIG. 5 shows specific examples of the low-pass filter (LPF) circuit 20. FIG. 5(A) is a type wherein parallel paths of resistive elements employed in a low-pass filter (LPF) circuit 21 are selected or changed over. When a switch circuit S1 is closed according to a control signal Scnt, the resistance values of resistive elements for determining the time constant of the filter result in a resistance value obtained by connecting resistive elemental devices R4 and R5 in parallel. When the switch circuit S1 is made open according to the control signal Scnt, the resistance value of the corresponding resistive element for determining the filter time constant results in a resistance value of the resistive elemental device R4 alone. Since a capacitive element corresponding to another component for determining the filter time constant is fixed as a capacitive elemental device C4, the filter time constant is determined according to the magnitude of the resistance values of the resistive elements. If the resistance values of the two resistive elemental devices R4 and R5 are assumed to be identical to each other, for example, then the switch circuit S1 is closed according to the control signal Scnt, and hence the total resistance value obtained when the two resistive elemental devices R4 and R5 are connected in parallel, results in substantially one-half the resistance value where the switch circuit S1 is opened so that the resistance value is given by the resistive elemental device R4 alone. Further, the time constant also becomes substantially one-half.

Figure 5B:
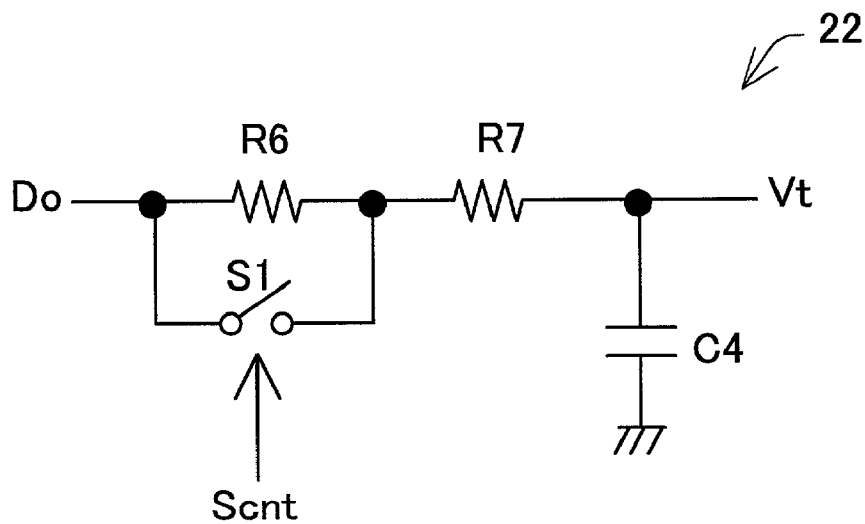

FIG. 5(B) is a type wherein both ends of one resistive elemental device R6 of two resistive elemental devices R6 and R7 connected in series are short-circuited and opened to perform switching between serial paths for resistive elements employed in a low-pass filter (LPF) circuit 22 shown in FIG. 5(B). When a switch circuit S1 is closed according to a control signal Scnt, both ends of the resistive elemental device R6 of the resistive elements for determining a filter time constant are short-circuited, so that the resistance value is brought to a resistance value of the resistive elemental device R7 alone. When the switch circuit S1 is open according to the control signal Scnt, the resistance values of the resistive elements for determining the filter time constant result in resistance values of the resistive elemental devices R6 and R7 connected in series. Since a capacitive element corresponding to another component for determining the filter time constant is fixed as a capacitive elemental device C4, the filter time constant is determined according to the magnitude of the resistance values of the resistive elemental devices. If the resistance values of the two resistive elemental devices R6 and R7 are assumed to be identical to each other, for example, then the resistance value at the time that the switch circuit S1 is closed according to the control signal Scnt and hence both ends of the resistive elemental device R6 are short-circuited, results in substantially one-half the resistance value obtained where the switch circuit S1 is opened to thereby connect the resistive elemental devices R6 and R7 in series. Further, the time constant also becomes substantially one-half the time constant in that case.

The PLL frequency synthesizer 2 according to the second embodiment selects a predetermined bypass path from a bypass path group included in the low-pass filter (LPF) circuit 20 by use of a selector switch circuit S1 during a period in which a pseudo correction pulse is outputted from a charge pump circuit 102 for each phase comparison period or cycle of a phase comparator 101 to change a filter characteristic, thereby making it possible to vary the signal flow of a feedback loop. As specific examples of the low-pass filter (LPF) circuit 20, may be considered, the low-pass filter (LPF) circuit 21 for performing switching between the parallel paths to thereby select a predetermined bypass path from a bypass path group, the low-pass filter (LPF) circuit 22 for performing switching between the serial paths to select a predetermined bypass path from a bypass path group, etc. Thus, the characteristic of response of a voltage-controlled oscillator 104 to the pseudo correction pulse outputted from the charge pump circuit 102 can be controlled while the signal flow of a feedback loop in a steady operating state other than a pseudo correction pulse output period set for each phase comparison period is being maintained. Selecting a predetermined bypass path large in filter time constant upon the steady operating state while a predetermined bypass path small in filter time constant in each of the low-pass filter (LPF) circuits 20 through 22 is selected and a high-speed lockup characteristic is maintained upon lockup, allows the suppression of spurious generation incident to the pseudo correction pulse.

Figure 6:
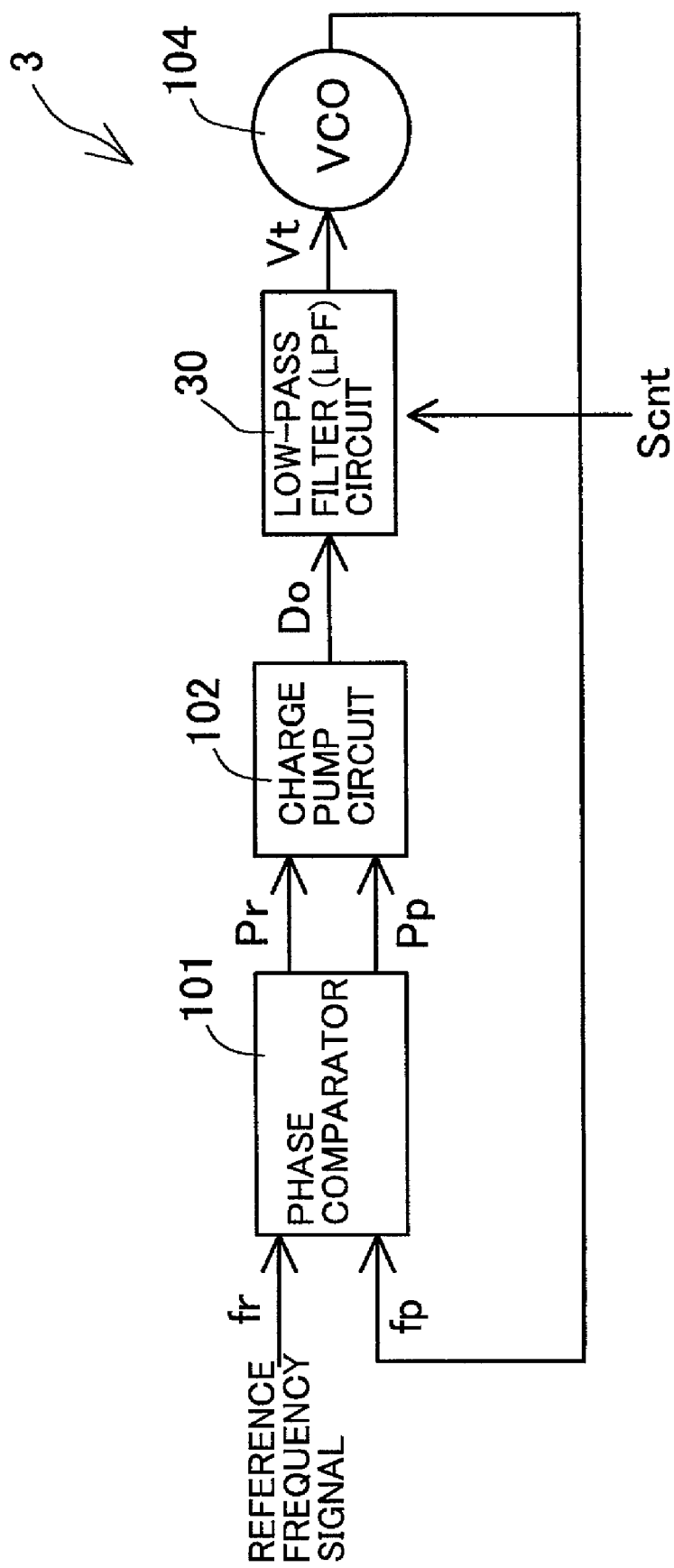
FIG. 6 is a function block diagram depicting a PLL frequency synthesizer according to a third embodiment of the present invention.

A PLL frequency synthesizer 3 according to a third embodiment shown in FIG. 6 is provided with a low-pass filter (LPF) circuit 30 capable of varying a filter characteristic according to a control signal Scnt as an alternative to the low-pass filter (LPF) circuit 103 in the PLL frequency synthesizer 100 according to the prior art shown in FIG. 11.

Figure 7:
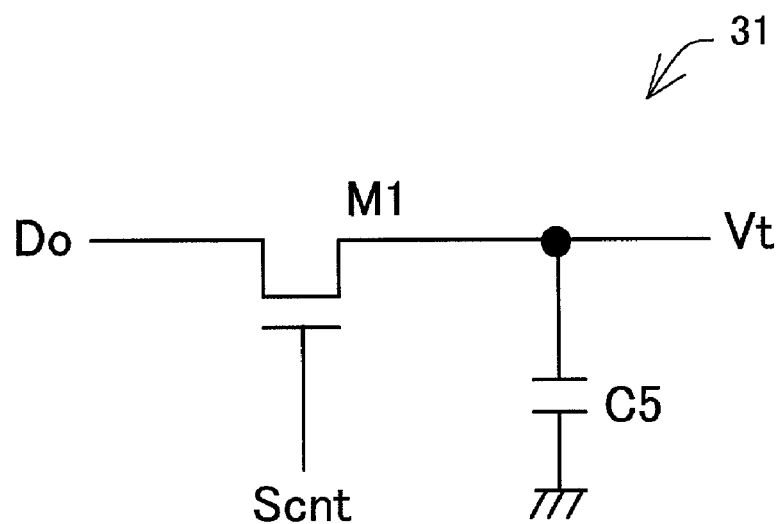
FIG. 7 is a circuit diagram showing a specific example of a low-pass filter (LPF) circuit employed in the third embodiment.

FIG. 7 shows a low-pass filter (LPF) circuit 31 as a specific example of the low-pass filter (LPF) circuit 30. In the low-pass filter (LPF) circuit 31, a MOS transistor M1 used as an active resistive elemental device constitutes a resistive element for determining a filter time constant, and a control signal Scnt is inputted to a gate terminal thereof. The control signal Scnt applied to the gate terminal of the MOS transistor M1 is an analog signal and varies an on resistance of the MOS transistor M1 according to a voltage value to thereby vary the filter time constant. Since, in this case, a capacitive element corresponding to another component for determining the filter time constant is fixed as a capacitive elemental device C5, the filter time constant can be varied according to the resistance value of the MOS transistor M1 corresponding to the resistive element.

During a period in which a pseudo correction pulse is outputted from a charge pump circuit 102 for each phase comparison cycle of a phase comparator 101, the PLL frequency synthesizer 3 according to the third embodiment controls a variable filter constituent element in the low-pass filter (LPF) circuit 30 to vary a filter characteristic, thereby allowing the signal flow of a feedback loop to change. For example, a low-pass filter (LPF) circuit 31 using a MOS transistor M1 used as a variable filter constituent element can be used as the low-pass filter (LPF) circuit 30. Thus, the characteristic of response of a voltage-controlled oscillator 104 to the pseudo correction pulse outputted from the charge pump circuit 102 can be controlled while maintaining the signal flow of the feedback loop in a steady operating state other than the pseudo correction pulse output period set for each phase comparison period. While the low-pass filter (LPF) circuits 30 and 31 are reduced in time constant to maintain a high-speed lockup characteristic upon lockup, the low-pass filter (LPF) circuits 30 and 31 are varied in filter characteristic in a steady operating state to increase their time constants. Consequently, spurious generation incident to the pseudo correction pulse can be suppressed.

A PLL frequency synthesizer 4 according to a fourth embodiment shown in FIG. 8 is provided with a charge pump circuit 40 capable of selecting the supply capability of a voltage output signal Do according to a control signal Scnt as an alternative to the charge pump circuit 102 in the PLL frequency synthesizer 100 according to the prior art shown in FIG. 11.

Figure 9A:
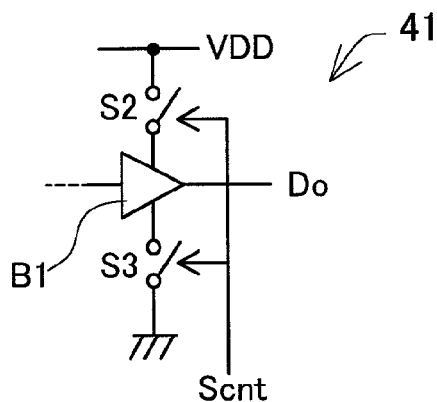
FIGS. 9A, 9B and 9C are circuit diagrams showing specific examples of a charge pump circuit employed in the fourth embodiment.

FIG. 9 shows three types of charge pump circuits 41 through 45 as specific examples of the charge pump circuit 40. The charge pump circuit 41 shown in FIG. 9(A) is a type that it opens or closes paths for outputting a voltage output signal Do. The charge pump circuit 41 is one wherein switch circuits S2 and S3 are inserted into their corresponding paths for supplying a source voltage VDD and a ground potential to an output-stage circuit B1 for the voltage output signal Do to thereby control their opening/closing according to a control signal Scnt. If the operation of opening or setting free the source voltage VDD and the ground potential is controlled according to a control signal Scnt so that it is carried out during a period in which a pseudo correction pulse is outputted from the charge pump circuit 40 for each phase comparison period of a phase comparator 101, then no source voltage VDD and ground potential are supplied to the output-stage circuit B1 during the period in which the pseudo correction pulse is outputted from the charge pump circuit 40, whereby the pseudo correction pulse is not outputted.

Figure 9B:
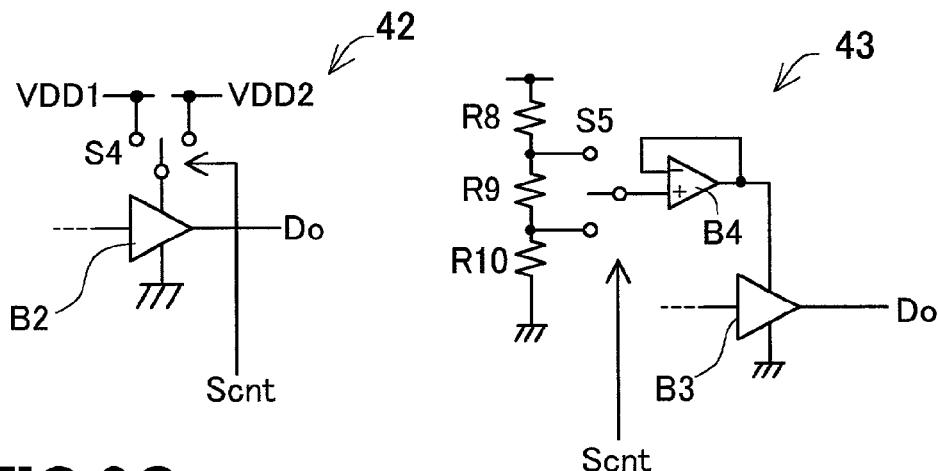

The charge pump circuits 42 and 43 shown in FIG. 9(B) are respectively types wherein the supply capability of source voltages to output-stage circuits B2 and B3 of the charge pump circuits 42 and 43 are switched over to thereby perform switching between driving capability of voltage output signals Do. In the charge pump circuit 42, a switch circuit S4 is controlled according to a control signal Scnt to switch a supplied source voltage between VDD1 and VDD2, thereby selecting the corresponding power supply capability. In the charge pump circuit 43, a value for setting an output voltage to a buffer circuit B4 for the supply of a source voltage is selected between voltage dividing resistors R8 through R10 through the use of a switch circuit S5 to thereby select and change the output voltage, whereby switching to the driving capability of the output-stage circuit B3 is performed.

Figure 9C:
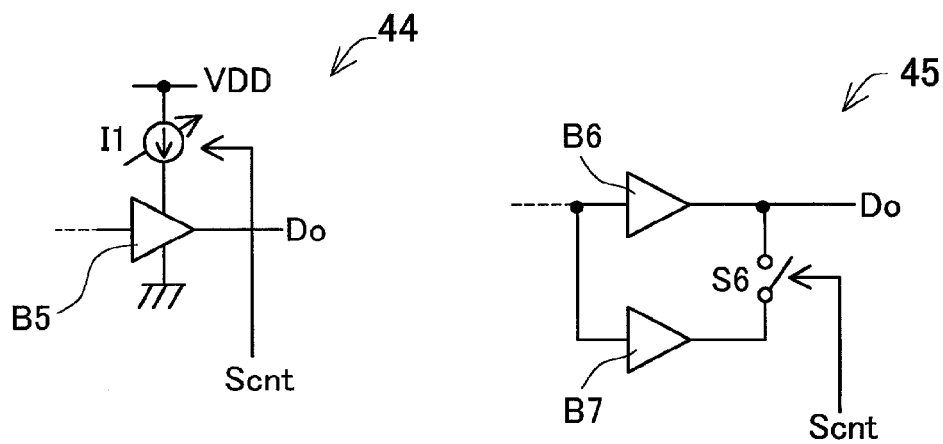

The charge pump circuits 44 and 45 shown in FIG. 9(C) are respectively types wherein current supply capability of output-stage circuits B5, B6 and B7 of the charge pump circuits 44 and 45 are respectively switched to select driving capability of voltage output signals Do. In the charge pump circuit 44, a current supply capability of a current source circuit I1 that defines the supply capability of a current from a source voltage VDD, is selected according to a control signal Scnt. In the charge pump circuit 45, a switch circuit S6 is open/close controlled according to a control signal Scnt to thereby selectively perform switching to either the use of an output-stage circuit used for the output of a voltage output signal Do as an output-stage circuit B6 alone or the addition of an output-stage circuit B7 to the output-stage circuit B6.

During the periods in which the pseudo correction pulses are outputted from the charge pump circuits 40 through 45 every phase comparison periods of the phase comparators 101, the PLL frequency synthesizer 4 according to the fourth embodiment is capable of switching the supply capability of the signals outputted from the charge pump circuits 40 through 45 through the use of the output capability switching circuits to thereby vary the signal flow of feedback loops respectively. As specific examples of the output capability switching circuit, there are known a type (see FIG. 9(A)) wherein the opening and closing of the paths for the supply of the source voltage VDD and the ground potential to the output-stage circuit B1 in the charge pump circuit 41 are switched, a type (see FIG. 9(B)) wherein the source voltages supplied to the output-stage circuits B2 and B3 in the charge pump circuits 42 and 43 are switched, a type (see FIG. 9(C)) wherein the current supply capability with respect to the output signals of the output-stage circuits B5, B6 and B7 in the charge pump circuits 44 and 45 are switched, etc. Thus, the characteristic of response of a voltage-controlled oscillator 104 to the pseudo correction pulse outputted from each of the charge pump circuits 40 through 45 can be controlled while the signal flow of the feedback loop in a steady operating state other than the pseudo correction pulse output period for each phase comparison period is being maintained. Further, spurious generation incident to the pseudo correction pulse can be suppressed in the steady operating state of the PLL frequency synthesizer 4.

The type (see FIG. 9(A)) for performing switching to the opening and closing of the paths for the supply of the source voltage VDD and the ground potential to the output-stage circuit B1 in the charge pump circuit 41 is capable of controlling the switch circuits S2 and S3 corresponding to the path opening/closing switch circuits during the period in which the pseudo correction pulse is outputted from the charge pump circuit 41 for each phase comparison period of the phase comparator 101 to open or set free the path for outputting the voltage output signal Do, corresponding to the output signal path of the charge pump circuit 41, thereby stopping the operation of the feedback loop. Thus, while the operation of the feedback loop placed in the steady operating state other than the pseudo correction pulse output period set for each phase comparison period is being maintained, the output of the pseudo correction pulse from the charge pump circuit 41 can be suppressed and spurious generation incident to the pseudo correction pulse can be suppressed in the steady operating state of the PLL frequency synthesizer 4.

Figure 10A:
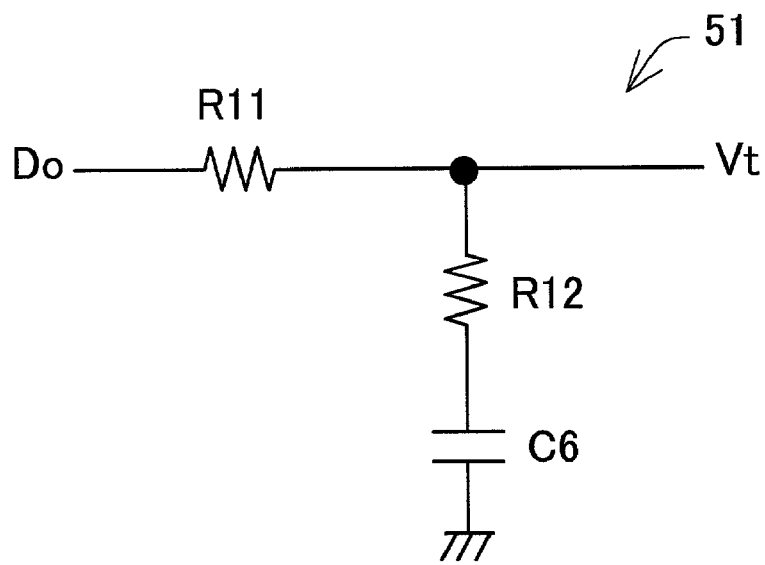
FIGS. 10A and 10B are circuit diagrams depicting a specific example of a low-pass filter (LPF) circuit.
Figure 10B:
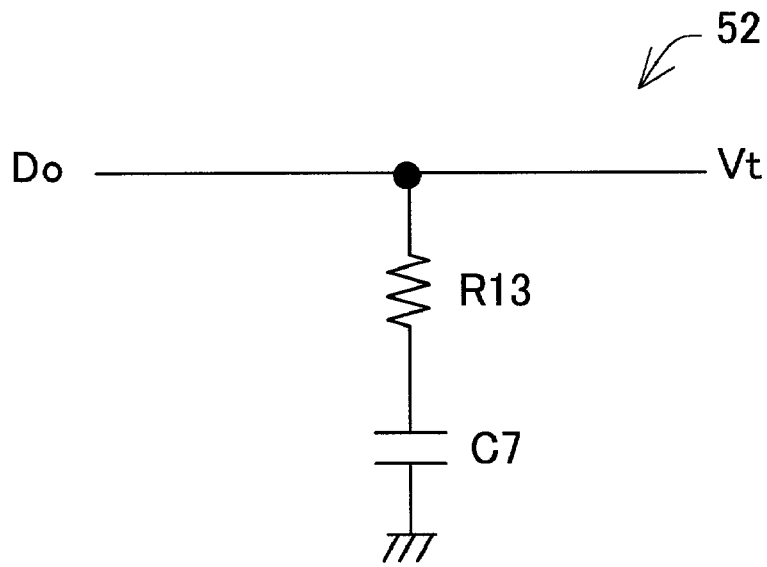

Now, the low-pass filter (LPF) circuits 103, 20 through 22, 30 and 31, loop filter circuit 12, and low-pass filter circuit 13 employed in the first through fourth embodiments may respectively be configured as a voltage-driven type (see FIG. 10(A)) or a current-driven type 52 (see FIG. 10(B)).

Incidentally, the present invention is not limited to the first through fourth embodiments. It is needless to say that various changes and modifications can be made thereto within the scope not departing from the substance thereof.

For instance, while the first embodiment has descried, as an example, the configuration wherein the switch circuit 10 for opening or closing the feedback loop is interposed between the low-pass filter (LPF) circuit 103 and the voltage-controlled oscillator (VCO) 104, the PLL frequency synthesizer according to the present invention is not limited to this, and the switch circuit may be inserted into another spot lying within the feedback loop.

While the specific example of the first embodiment has described, as an example, the configuration wherein the transmission gate 11 comprised of the MOS transistor is provided as the specific example of the switch circuit 10, the PLL frequency synthesizer according to the present invention is not limited to it. The switch circuit may comprise a JFET transistor, another switching element, or a switching circuit in addition to the configuration in which the switch circuit comprises the MOS transistor.

Further, while the configuration wherein the R frequency divider 105 divides the reference frequency signal by R into the frequency signal fr, and the frequency signal fr is inputted to the phase comparator 101 together with the frequency signal fp obtained by dividing the output frequency signal by N by means of the N frequency divider 106, whereby they are phase-compared, has been described as an illustrative example, the PLL frequency synthesizer according to the present invention is not limited to it. The PLL frequency synthesizer may take a configuration wherein no frequency dividers are used. While the control circuits 107 outputs the control signal Scnt, based on the reference frequency signal and the frequency signal fr obtained by dividing the reference frequency signal by R, the present invention is not limited to it. With the reference frequency signal as a trigger, the time up to the elapse of a predetermined time may be taken as an output period of the control signal Scnt, or the control signal Scnt may be produced based on the output frequency signal or divided-by-N frequency signal fp, or the control signal Scnt may be outputted with the inclusion of the pseudo correction pulse output period in the voltage output signal Do.

While the second embodiment has described the respective cases in which the resistive elemental devices constituting the resistive elements for determining the filter time constants according to the control signals Scnt respectively are connected in parallel and connected in series, the present invention is not limited to the above. The present invention may take a configuration wherein both the parallel-connected portion and the series-connected portion are provided in mixed form.

While the third embodiment has described, as an example, the case in which the resistive element for determining the filter time constant is made up of the MOS transistor M1, the present invention is not limited to it. In addition to the case in which it comprises the MOS transistor, a variable resistive elemental device such as a JFET transistor, etc. may be used.

According to the present invention, a PLL frequency synthesizer can be provided wherein the signal flow of a feedback loop is periodically varied only during a period in which a pseudo correction pulse is outputted from a charge pump circuit, or the operation of the feedback loop is periodically stopped, whereby while a high-speed lockup characteristic is being ensured, the response made by the pseudo correction pulse is inhibited to improve even a spurious characteristic in a lock state, thereby allowing the implementation of satisfactory communication quality.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalent.

What is claimed is:

1. A PLL frequency synthesizer, comprising:
   a voltage-controlled oscillator for outputting an output frequency signal corresponding to a control voltage signal;

a phase comparator for outputting an output signal corresponding to a phase comparison between the output frequency signal and a reference frequency signal; and a charge pump circuit for varying the control voltage signal according to the phase-compared signal;

whereby a feedback loop in a locked state is configured, wherein signal flow of the feedback loop is periodically varied in a predetermined period, the predetermined period including the timing of performing an operation of phase comparison between the output frequency signal and the reference signal in the phase comparator.

2. The PLL frequency synthesizer according to claim 1, wherein the operation of the feedback loop periodically stops in a phase comparison cycle used in the phase comparator.

3. The PLL frequency synthesizer according to claim 2, wherein the feedback loop includes a loop opening/closing switch circuit therewithin.

4. The PLL frequency synthesizer according to claim 3, wherein a first filter circuit and a second filter circuit for determining the signal flow of the feedback loop are provided in a path which extends from the charge pump circuit to the voltage-controlled oscillator, and the loop opening/closing switch circuit is provided between the first filter circuit and the second filter circuit.

5. The PLL frequency synthesizer according to claim 3, wherein the loop opening/closing switch circuit includes an MOS transistor.

6. The PLL frequency synthesizer according to claim 3, wherein the loop opening/closing switch circuit includes a JFET transistor.

7. The PLL frequency synthesizer according to claim 2, wherein the feedback loop stops the output of an output signal from the charge pump circuit.

8. The PLL frequency synthesizer according to claim 7, wherein the charge pump circuit includes a path opening/closing switch circuit in an output path for an output signal outputted from the charge pump circuit.

9. The PLL frequency synthesizer according to claim 8, wherein the path opening/closing switch circuit includes an MOS transistor.

10. The PLL frequency synthesizer according to claim 8, wherein the path opening/closing switch circuit includes a JFET transistor.

11. The PLL frequency synthesizer according to claim 1, wherein at least one filter circuit for determining the signal flow of the feedback loop is provided in a path which extends from the charge pump circuit to the voltage-controlled oscillator, and the filter characteristic of the filter circuit is periodically varied in a phase comparison cycle of the phase comparator.

12. The PLL frequency synthesizer according to claim 11, wherein the filter circuit includes, a bypass path group having at least two bypass paths different in filter characteristic, and a selector switch circuit which selects a predetermined bypass path from the bypass path group.

13. The PLL frequency synthesizer according to claim 12, wherein the bypass path group includes, at least two filter constituent elements connected in parallel, and the selector switch circuit which selectively switch at least one of the filter constituent elements as a constituent part of the predetermined bypass path.

14. The PLL frequency synthesizer according to claim 12, wherein the bypass path group includes, at least two filter constituent elements connected in series, and the selector switch circuit which selects at least one of the filter constituent elements by short-circuiting.

15. The PLL frequency synthesizer according to claim 12, wherein the selector which circuit includes a MOS transistor.

16. The PLL frequency synthesizer according to claim 12, wherein the selector switch circuit includes a JFET transistor.

17. The PLL frequency synthesizer according to claim 11, wherein the filter circuit includes a variable filter constituent element for varying the filter characteristic thereof.

18. The PLL frequency synthesizer according to claim 17, wherein the variable filter constituent element is an active resistive elemental device.

19. The PLL frequency synthesizer according to claim 18, wherein the active resistive elemental device is a MOS transistor.

20. The PLL frequency synthesizer according to claim 18, wherein the active resistive elemental device is a JFET transistor.

21. The PLL frequency synthesizer according to claim 1, wherein the charge pump circuit includes an output capability switching circuit for selecting the capability of supply of an output signal outputted from the charge pump circuit.

22. The PLL frequency synthesizer according to claim 21, wherein the output capability switching circuit selects a drive power source voltage for an output-stage circuit of the charge pump circuit.

23. The PLL frequency synthesizer according to claim 21, wherein the output capability switching circuit selects a drive current for an output-stage circuit of the charge pump circuit.

24. The PLL frequency synthesizer according to claim 21, wherein the output capability switching circuit selects an output transistor size for an output-stage circuit of the charge pump circuit.

25. The PLL frequency synthesizer according to claim 1, wherein a period in which the characteristic variation or the operation stop is performed includes an output period of the reference frequency signal subjected to comparison in the phase comparator.

26. The PLL frequency synthesizer according to claim 25, further including a frequency divider for frequency-dividing the reference frequency signal, and wherein a frequency signal compared in the phase comparator is a divided frequency signal outputted from the frequency divider.

27. The PLL frequency synthesizer according to claim 4, wherein the filter circuit is either a voltage-driven type or a current-driven type.

28. The PLL frequency synthesizer according to claim 11, wherein the filter circuit is either a voltage-driven type or a current-driven type.

* * * * *